United States Patent
Kouwenhoven

(10) Patent No.: US 7,180,289 B2
(45) Date of Patent: Feb. 20, 2007

(54) MAGNETIC RESONANCE IMAGING METHOD

(75) Inventor: Marc Kouwenhoven, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 148 days.

(21) Appl. No.: 10/516,601

(22) PCT Filed: May 21, 2003

(86) PCT No.: PCT/IB03/02162

§ 371 (c)(1),
(2), (4) Date: Dec. 3, 2004

(87) PCT Pub. No.: WO03/104832

PCT Pub. Date: Dec. 18, 2003

(65) Prior Publication Data

US 2005/0146328 A1    Jul. 7, 2005

(30) Foreign Application Priority Data

Jun. 10, 2002    (EP) ................... 02077260

(51) Int. Cl.
*G01V 3/00* (2006.01)
(52) U.S. Cl. ....................... 324/309; 324/307
(58) Field of Classification Search ........ 324/309, 324/307, 306
See application file for complete search history.

(56) References Cited

U.S. PATENT DOCUMENTS

| | | | |
|---|---|---|---|
| 4,322,684 A | * | 3/1982 | Hounsfield .......... 324/309 |
| 4,710,716 A | * | 12/1987 | Keren et al. .......... 324/309 |
| 4,871,966 A | * | 10/1989 | Smith et al. .......... 324/309 |
| 4,933,639 A | | 6/1990 | Barker |

FOREIGN PATENT DOCUMENTS

| | | |
|---|---|---|
| EP | 0 366 232 A2 | 5/1990 |
| EP | 0 377 267 A2 | 7/1990 |
| WO | WO 88/04058 | 6/1988 |
| WO | WO 02/04971 A2 | 1/2002 |

OTHER PUBLICATIONS

Leifer, et al.; NMR Volume Imaging with Half Slice Offsets; 1985; SMRM, pp. 1013-1014.

(Continued)

*Primary Examiner*—Louis M. Arana
(74) *Attorney, Agent, or Firm*—Fay, Sharpe, Fagan, Minnich & McKee

(57) ABSTRACT

A magnetic resonance imaging method for forming forms an image of an object from a plurality of signals acquired by an array of multiple receiver antennae, and in which spins are excited in a pail of the object. Slices (22) are selected with a predetermined field-of-view for scanning the object and are rotated uniformly over a predetermined angle. MR signals are measured along a predetermined trajectory containing a plurality of lines of slices in k-space by application of a read gradient and other gradients. Further slices (24) are shifted in a lengthwise direction obtaining a staggered arrangement such that the beginning and end of each slice are at least approximately within the area covered by the slices before rotation.

10 Claims, 2 Drawing Sheets

OTHER PUBLICATIONS

Pruessmann, et al.; Coli Sensitivity Maps for Sensitivity Encoding and Intensity Correction; 1998, ISMRM, p. 2087.

Pruessmann, et al.; Coli Sensitivity Encoding for Fast MRI; 1998, ISMRM, p. 579.

Weiger, et al.; Cardiac Real-Time Acquisition Using Coil Sensitivity Encoding; 1998, ISMRM, p. 803.

Weiger, et al.; Accellerated Cardiac Breathhold Imaging Using Coil Sensitivity Encoding; 1998, ISMRM, p. 799.

Hangiandreou, et al.; Interactive Selection of Optimal Section Orientations Using Real-Time MRI; 1995, MRM, 34:114-119.

Larkman, D.J., et al.; Use of Multi-Coil Arrays for Separation of Signal from Multiple Slices Simultaneously Excited; 1999, ISMRM, abstract.

Sodickson, et al.; Accelerated Coronary MRA in Volunteers . . . ; Proc. Intl.Soc.Mag. Res. in Med.; 1999; 2: 1249.

Weiger, et al.; Cardiac Real-Time Imaging Using SENSE; 2000; MRM; 43:177-184.

* cited by examiner

MAGNETIC RESONANCE IMAGING METHOD

BACKGROUND

The invention relates to a magnetic resonance (MR) method for the imaging of an object arranged in a steady magnetic field, whereas the following steps being repeatedly executed according to said method:
excitation of spins in a part of the object,
slices are selected within the Field-of-View (FOV) of the object to be scanned,
said selected slices are scanned in an oblique relationship with respect to the Cartesian coordinate system of a rectangular area of interest, and
measurement of MR signals along a predetermined trajectory containing a plurality of lines in said slices in k-space by application of a read gradient and other gradients.

The invention also relates to an MR device for carrying out such a method.

It is generally known in multiple slice imaging techniques that parallel slices are imaged in such a manner that if parallel slices are rotated they are kept at the same position to each other in order to obtain a proper image of the object. However, backfolding artifacts cannot always be prevented as parts outside of the rectangular FOV will be covered also by the scan.

In magnetic resonance imaging there is further a general tendency to obtain acceptable images within shorter periods of time. For this reason the sensitivity encoding method called "SENSE" has recently been developed by the Institute of Biomedical Engineering and Medical Informations, University and ETH Zürich, Switzerland. The SENSE method is based on an algorithm which acts directly on the image as detected by the coils of the magnetic resonance apparatus and which subsequent encoding steps can be skipped and hence an acceleration of the signal acquisition for imaging by a factor of about two to three can be obtained. Crucial for the SENSE method is the knowledge of the sensitivity of the coils which are arranged in so called sensitivity maps. In order to accelerate this method there are proposals to use raw sensitivity maps which can be obtained through division by either the "sum-of-squares" of the single coil references or by an optional body coil reference (see e.g. K. Pruessmann et. al. in Proc. ISMRM, 1998, abstracts pp. 579, 799, 803 and 2087). In fact the SENSE method allows for a decrease in scan time by deliberately undersampling k-space, i.e. deliberately selecting a scanning Field-of-View (FOV) that is smaller than the object to be acquired. From this undersampling fold-over artifacts are obtained which can be resolved or unfolded by the use of the knowledge of a set of distinct coils having different coil sensitivity patterns. The undersampling can be in either one of both phase-encoding directions.

If the object exceeds the FOV to be reconstructed (in the phase encoding SENSE direction) residual backfolding will occur with the SENSE method which will be apparent somewhere in the middle of the image.

SUMMARY

It is an object of the present invention to prevent forming of backfolding artifacts both with and without the SENSE technique as mentioned above.

The method according to the present invention has the important advantage, that in a very easy manner the forming of residual backfolding artifacts is prevented.

These and other advantages of the invention are disclosed in the dependent claims and in the following description in which an exemplified embodiment of the invention is described with respect to the accompanying drawings.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

Figure 1:
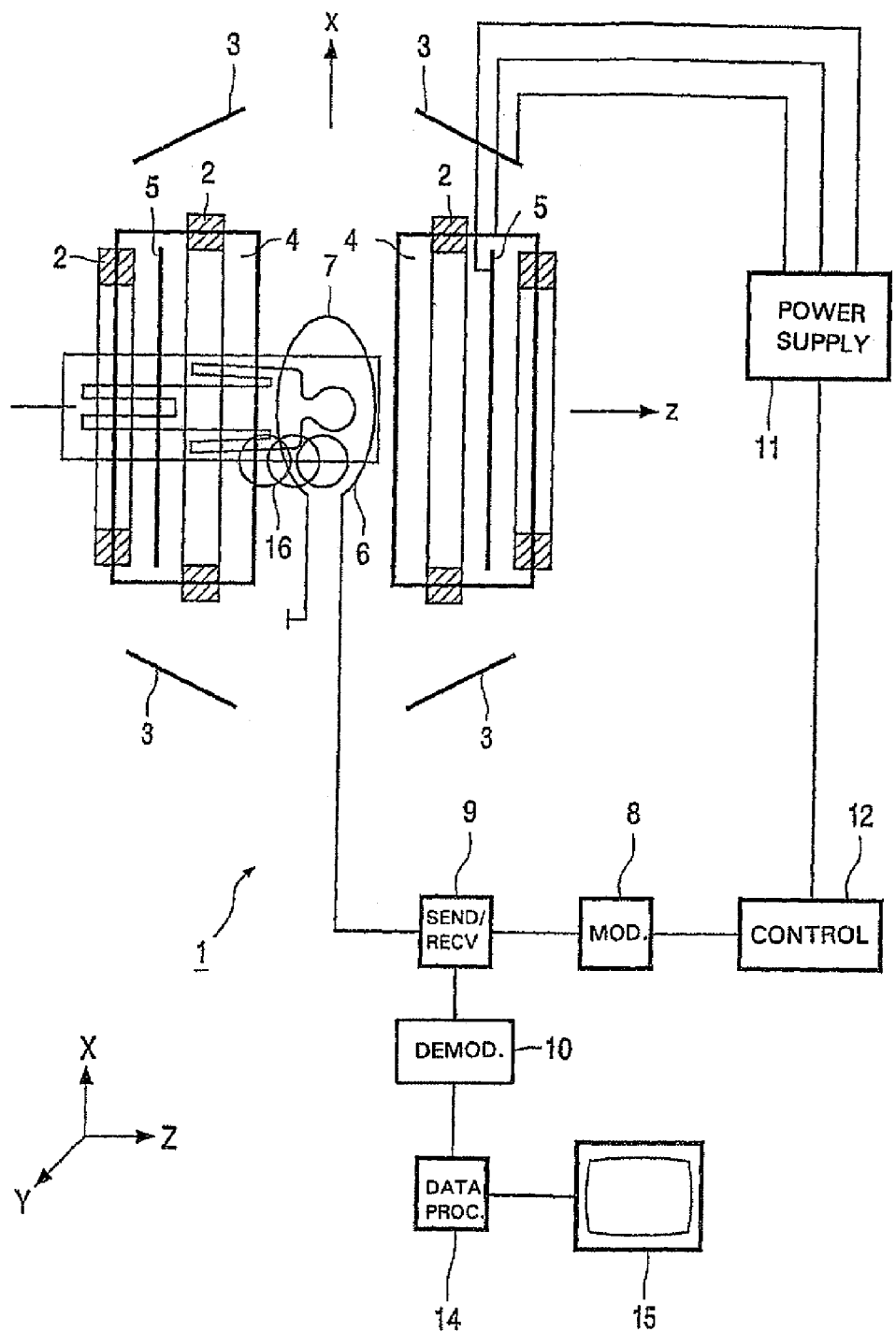
FIG. 1 is an MR apparatus for carrying out the method.

In FIG. 1 a magnetic resonance apparatus 1 is diagrammatically shown. The apparatus comprises a set of main magnetic coils 2 for generating a stationary homogeneous main magnetic field and several sets of gradient coils 3, 4 and 5 for superimposing on to the main magnetic field additional magnetic fields with controllable strength and having a gradient in a selected direction. Conventionally, the direction of the main magnetic field is labeled the z direction, the two directions perpendicular thereto are the x and y directions. The gradient coils are energized via a power supply 11. The apparatus further comprises excitation means 6 in the form of a so-called body coil for emitting radio-frequency pulses (RF-pulses) to an object or body 7, the excitation means 6 being coupled to modulating means 8 for generating and modulating of the RF-pulses. Also provided are means for receiving the MR-signals, these means can be identical to the excitation means 6 or be separate, as with the present invention, in the form of an array of receiver coils 16. A body coil is a coil surrounding a (part of a) body and has generally a very homogeneous sensitivity distribution, whereas a receiver coil is a coil used close to one side of a (part of a) body. A receiver coil has generally a limited field of view, a high sensitivity but an inhomogeneous spatial sensitivity distribution. A send-receive switch 9 is arranged to separate the received signals from the excitation pulses. The received magnetic resonance signals are input to receiving and demodulating means 10. The excitation means 6 and modulating means 8 and the power supply 11 for the gradient coils 3, 4 and 5 are steered by a control system 12 to generate a predetermined sequence of RF-pulses and gradient field pulses. The demodulation means is coupled to data processing means 14, for example a computer, for transformation of the received signals into an image that can be made visible, for example on a visual display unit 15.

If the magnetic resonance apparatus 1 is put into operation with an object or body 7 placed in the magnetic field, a small excess of magnetic dipole moments (nuclear or electron spins) in the body will be aligned in the direction of the magnetic field. In equilibrium, this causes a net magnetization $M_0$ in the material of the body 7, directed in parallel with the magnetic field. In the apparatus 1 the macroscopic magnetization $M_0$ is manipulated by radiating to the body RF-pulses having a frequency equal to the Larmor frequency of the dipole moments, thereby bringing the dipole moments in an exited state and re-orienting the magnetization $M_0$. By applying the proper RF-pulses, a rotation of the macroscopic magnetization is obtained, the angle of rotation is called the flip-angle. The introduction of variations in the magnetic field by applying gradient magnetic fields influences the behavior of the magnetization locally. After the application of RF-pulses, the changed magnetization will tend to return to a state of thermal equilibrium in the magnetic field, emitting radiation in the process. A well chosen sequence of RF-pulses and gradient field pulses causes the radiation to be emitted as (decaying) magnetic resonance signals which provide spatial information about the density and/or relaxation times of a certain type of nuclei, for example hydrogen nuclei, and the substance in which they occur. By analysis of the emitted signals, picked up by the coil 6 or with the receiver coil array 16—and by presentation of it in the form of images, information about the internal structure of the object or body 7 is accessible. The decaying magnetic resonance signal directly after the excitation is called FID (Free Induction Decay). By proper application of the gradients and/or application of additional excitation (RF) pulses also an echo of the FID may be produced and used to derive image information. For a more detailed description of magnetic resonance imaging (MRI) and MRI-devices reference is made to the extensive literature on this subject, for example to the book "Magnetic Resonance Imaging", by M. T. Vlaardingerbroek, Springer Verlag, 1996.

Figure 2A:
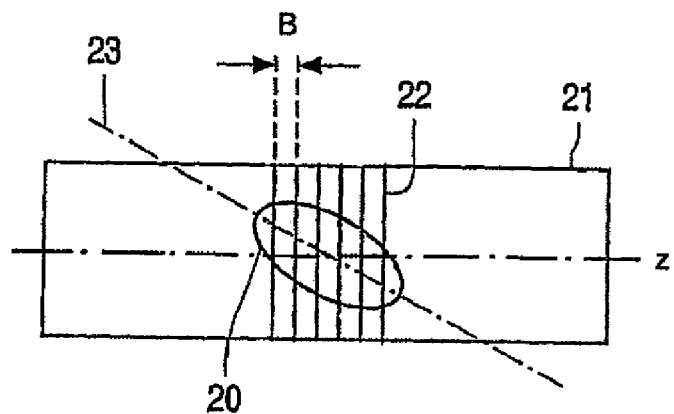
FIGS. 2a, 2b and 2c are three panes to explain the inventive method.
Figure 2B:
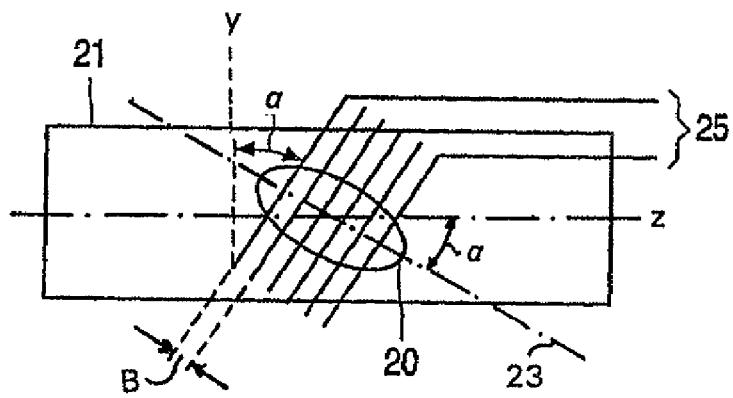
Figure 2C:
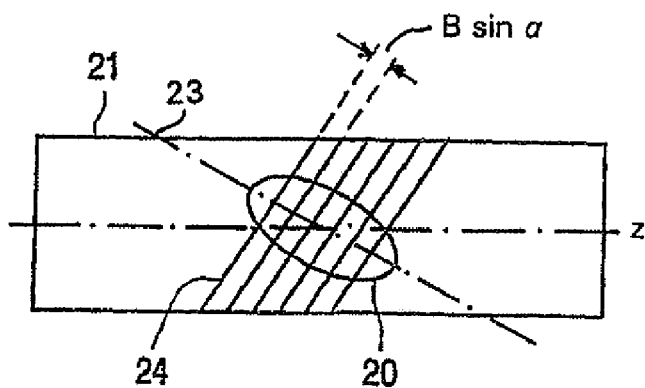

In FIG. 2a an object 20 to be scanned (e.g. the heart) which is surrounded by a rectangular area of interest 21 (e.g. part of the human body) is shown which will be scanned with the above mentioned MR apparatus 1 in parallel slices 22 which are set by the user. Imaging occurs in a rectangular area, the length thereof is determined by the Field-of-View (FOV) and the width there of is determined by the so-called Rectangular Field-of-View (RFOV), which can be freely defined by the operator of the MR machine. The RFOV direction is also the foldover direction (and can be also a SENSE encoding direction), in our example in FIGS. 2a, 2b, and 2c. As can be seen the longitudinal axis 23 of the object to be scanned is at an angle α to the direction z of the RFOV or to the z axis of the Cartesian coordinate system of the rectangular area of interest 21, i.e. the FOV. Thus, according to FIG. 2b the slices 22 are rotated over an angle α in order to obtain an improved imaging of the object 20. However, since the slices 22 are normally kept in an exact parallel relationship, part of the slices 22 fall out of the area as covered by the original RFOV. When the angle α is for example 30° and the thickness B of the slices 22 is 1 cm with a gap of 0 cm between the slices 22, then the area 25 will cover 5 cm in vertical direction y. Now, according to FIG. 2c the rotated slices 22 are shifted in their longitudinal direction over a distance B* sin α so that the start positions and the end positions of the slices 22 coincide approximately with the area of the RFOV. Thus, the slices 22 do not fall outside of the original RFOV from the slices before rotation (FIG. 2a) and any tissue outside of that area will not be covered any more, thus preventing any backfolding artifacts. Especially for fast sampling methods like SENSE this is crucial as residual backfolding artifacts would lead to serious artifacts which cannot be suppressed easily. Additionally to the shift of the slices 22 the lines to be scanned within the slices 24 can have a uniform offset at a direction perpendicular to the direction of the respective slice 22. Additionally or alternatively the original RFOV may be diminished which leads to faster scanning.

Instead of rotating the slices 22 also an oblique direction with respect to the rectangular orientation of the original slices can be selected for scanning the slices 22.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A magnetic resonance imaging method for forming an image of an object from a plurality of signals acquired by an array of multiple receiver antennae, comprising:
    exciting spins in a part of the object,
    selecting slices within a predetermined rectangular Field-of-View having a Cartesian coordinate system for scanning the object,
    scanning said selected slices in an oblique relationship with respect to the cartesian coordinate system of said Field-of-View, such that a center of each of the oblique slice lies along a longitudinal axis of the Cartesian coordinate system of the Field-of-View and such that edges of the oblique slices are contained in the Field-of-View,
    measuring MR signals along a predetermined trajectory containing a plurality of lines in said slices in k-space by application of a read gradient and other gradients.

2. A method as claimed in claim 1, wherein each of the selected slices are rotated uniformly about its center over a predetermined angle in order to obtain said oblique relationship.

3. A method as claimed in claim 1, wherein the edge of any subsequent slice with respect to the prior one is shifted over the slice thickness multiplied with the sine of the rotating angle.

4. A method as claimed in claim 3, wherein lines to be scanned within each of said slices have a uniform offset along a line perpendicular to the direction of the slice.

5. A magnetic resonance imaging apparatus including a computer programmed to perform the method of claim 1.

6. A magnetic resonance imaging apparatus for obtaining an MR image from a plurality of signals comprising:
    means for excitation of spins in a part of the object,
    means for selection of slices with a predetermined Field-of-View for scanning the object,
    means for setting scanning parameters to scan said slices:
        in an oblique relationship with respect to a Cartesian coordinate system of said Field-of-View,
        such a manner that tissue outside the predetermined Field-of-View is not covered,
        such that beginning position of each slice center positions of each slice and end position of each slice, lie along lines parallel to a longitudinal coordinate of the Cartesian coordinate system of the Field-of-View, and
        such that the beginning and the end position of each of said slices are within the Field-of-View, and
        means for measuring MR signals along a predetermined trajectory containing a plurality of lines in said slices in k-space by application of a read gradient and other gradients.

7. A magnetic resonance imaging apparatus as claimed in claim 6, further comprising means for rotating the selected slices uniformly over a predetermined angle in order to obtain said oblique relationship.

8. A computer program product stored on a computer usable medium for forming an image by means of the magnetic resonance method, comprising a computer readable program means for causing the computer to control the execution of:
    excitation of spins in a part of the object,
    selection of slices with a predetermined Field-of-View, selecting said slices to be scanned in an oblique relationship with respect to the cartesian coordinate system of a rectangular area of interest, measuring MR signals along a predetermined trajectory containing a plurality of lines in said slices in k-space by application of a read gradient and other gradients, setting the scanning direction of said slices in such a manner that tissue outside the area of interest is not covered, and positioning said slices in lengthwise direction obtaining a staggered arrangement of said slices such that the beginning and the end positions of each of said slices are at least approximately within the area covered by the slices before rotation.

9. A computer program product according to claim 8, comprising rotating the slices uniformly over a predetermined angle in order to obtain said oblique relationship.

10. A computer program product according to claim 8, comprising providing of a uniform offset along a line perpendicular to the direction of the slice for lines to be scanned within each of said slices.

* * * * *